United States Patent
Li et al.

(10) Patent No.: US 9,305,509 B2
(45) Date of Patent: Apr. 5, 2016

(54) SHIFT REGISTER UNIT, GATE DRIVING CIRCUIT AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fuqiang Li, Beijing (CN); Cheng Li, Beijing (CN); Seong Jun An, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/368,403

(22) PCT Filed: Nov. 11, 2013

(86) PCT No.: PCT/CN2013/086891
§ 371 (c)(1),
(2) Date: Jun. 24, 2014

(87) PCT Pub. No.: WO2014/169626
PCT Pub. Date: Oct. 23, 2014

(65) Prior Publication Data
US 2015/0243237 A1   Aug. 27, 2015

(30) Foreign Application Priority Data
Apr. 15, 2013   (CN) .......................... 2013 1 0128679

(51) Int. Cl.
*G09G 3/36* (2006.01)
*G09G 3/00* (2006.01)
*G11C 19/28* (2006.01)

(52) U.S. Cl.
CPC ................ *G09G 3/3677* (2013.01); *G09G 3/00* (2013.01); *G11C 19/28* (2013.01); *G11C 19/287* (2013.01); *G09G 2310/0286* (2013.01)

(58) Field of Classification Search
CPC ..................... G09G 3/3677; G09G 2310/0286; G11C 19/28
See application file for complete search history.

(56) References Cited

U.S. PATENT DOCUMENTS

| | | | |
|---|---|---|---|
| 2008/0002803 A1* | 1/2008 | Kim et al. ....................... | 377/64 |
| 2013/0100007 A1* | 4/2013 | Yamamoto et al. ........... | 345/100 |

FOREIGN PATENT DOCUMENTS

| | | |
|---|---|---|
| CN | 102081969 A | 6/2011 |
| CN | 102903323 A | 1/2013 |
| CN | 103208251 A | 7/2013 |
| JP | 2002-132203 A | 5/2002 |

OTHER PUBLICATIONS

First Chinese Office Action Appln. No. 201310128679.8; Dated Feb. 4, 2015.
International Search Report dated Jan. 13, 2013; PCT/CN2013/086891.
Written Opinion of the International Searching Authority dated Jan. 28, 2013; PCT/CN2013/086891.

* cited by examiner

*Primary Examiner* — Ilana Spar
*Assistant Examiner* — Mihir Rayan
(74) *Attorney, Agent, or Firm* — Ladas & Parry LLP

(57) ABSTRACT

The present disclosure relates to the technical field of display. Provided are a shift register unit, a gate driving circuit and a display apparatus, the shift register unit includes an inputting module, a first outputting module and a second outputting module. As compared with the prior art, the structure of the shift register unit can be simplified effectively, and the number of use of the transistors can be further reduced. Embodiments of the present disclosure are used to implement scanning and driving.

19 Claims, 3 Drawing Sheets

SHIFT REGISTER UNIT, GATE DRIVING CIRCUIT AND DISPLAY APPARATUS

TECHNICAL FIELD

The present disclosure relates to the technical field of display, and more particularly, to a shift register unit, a gate driving circuit and a display apparatus.

BACKGROUND

The basic principle for displaying a frame of picture by a Thin Film Transistor-Liquid Crystal Display (TFT-LCD) is as follows: a square wave with a certain width is inputted to each of pixel rows sequentially from up to down by a gate driver to strobe each of the pixel rows, and then signals required by each of pixel rows are outputted sequentially from up to down by a source driver. Recently, a display device with such structure is generally manufactured by making a gate driving circuit and a source driving circuit on a glass panel with a COF (Chip on Film) process or a COG (Chip on Glass, that is, the chip is fixed on the glass directly) process, however, when a resolution is high, outputs of both the gate driver and the source driver are more and a length of the driving circuit would increase, which is disadvantageous for a bonding process of a module driving circuit.

In order to overcome the above problem, a design of GOA (Gate Driver on Array) circuit is commonly utilized in the manufacture of existing display devices. Compared with the traditional COF or COG process, the GOA circuit not only saves the cost, but also may achieve a beautiful appearance having two symmetrical sides on the panel, meanwhile the GOA circuit removes the Bonding area and its periphery wiring space of the gate driving circuit, so that it realizes a thin frame design for the display apparatus and improves a produce capacity and a yield of the display apparatus.

In the existing design for the GOA circuit, in order to realize precise controlling to each stage of gate driving signals, it is necessary for each stage of shift register unit to comprise a plurality of functional modules, such as a pulling-up module and a pulling-down module for realizing high-low changes in potentials of gate driving signals, a control module for control a pulling-up state or a pulling-down state and an inputting module for performing a scan or reset function, and each functional module further comprises a plurality of transistors. With continual developments of the display technique, people's requirements on the display apparatus with the thin frame are increasing. The key of the display apparatus with the thin frame is how to further reduce the number of use of the transistors in the GOA circuit. In the existing design for the GOA circuit, the structure is complex because of a limitation caused by the plurality of the functional modules in the shift register unit, and thus it is difficult to further reduce the number of use of the transistors.

SUMMARY

There provide in the embodiments of the present disclosure a shift register unit, a gate driving circuit and a display apparatus, which are capable of simplifying a structure of the shift register unit and further reducing the number of use of the transistors.

In order to settle the problems in the prior art, the embodiments of the present disclosure utilize solutions as follows.

According to an aspect of the embodiments of the present disclosure, there is provided a shift register unit comprising:

an inputting module, which is connected with a first signal input terminal, a second signal input terminal, a first voltage terminal, a second voltage terminal and a first outputting module, and configured to control a scan direction of the shift register unit according to a signal inputted from the first signal input terminal, a signal inputted from the second signal input terminal, a voltage inputted from the first voltage terminal and a voltage inputted from the second voltage terminal;

the first outputting module, which is connected with a first clock signal terminal, a first node and a first signal output terminal, and configured to control a potential of a signal outputted from the first signal output terminal according to a signal outputted from the inputting module and a first clock signal inputted from the first clock signal terminal, the first node is a connection node of the first outputting module and a second outputting module; and the second outputting module, which is connected with the first node, a second clock signal terminal and a second signal output terminal, and configured to control a potential of a signal outputted from the second signal output terminal according to a signal at the first node and a second clock signal inputted from the second clock signal terminal.

According to another aspect of the embodiments of the present disclosure, there is provided a gate driving circuit comprising a plurality of stages of the shift register units described above:

except for a first stage of shift register unit, a signal output terminal at a current stage of each shift register unit among the remaining is connected with a second signal input terminal of a previous stage of shift register unit adjacent thereto; and except for a last stage of shift register unit, the signal output terminal at the current stage of each shift register unit among the remaining is connected with a first signal input terminal of a next stage of shift register unit adjacent thereto.

According to a further aspect of the embodiments of the present disclosure, there is provided a display apparatus comprising the gate driving circuit described above.

In the shift register unit, the gate driving circuit and the display apparatus according to the embodiments of the present disclosure, the number of function modules in the shift register unit can be reduced effectively, the structure of the shift register unit can be simplified, so that the number of use of the transistors can be further reduced and therefore a thin frame design for the display apparatus is realized while the circuit is ensured to operate stably.

DETAILED DESCRIPTION

Thereafter, solutions of embodiments of the present disclosure will be described clearly and completely in connection with drawings of the embodiments of the present disclosure, but obviously the described embodiments are only some, but not all of the embodiments of the present disclosure. Any other embodiments obtained by those ordinary skilled in the art based on the embodiments of the present disclosure without inventive labors should fall into a scope sought for protection in the present disclosure.

All of transistors utilized in all embodiments of the present disclosure may be thin film transistors or field effect transistors or any other devices with same characteristics, and because a source and a drain of the transistor utilized herein are symmetrical, there is no difference between the source and the drain. In the embodiments of the present disclosure, in order to distinguish two electrodes except for a gate of the transistor, one electrode therein is referred to as a first electrode while the other electrode is referred to as a second electrode. Further, the transistor may be classified as a N-type and a P-type according to its characteristics. In the embodiments of the present disclosure, the each stage of shift register unit may comprise a plurality of N-type transistors and a plurality of P-type transistors at the same time, wherein the first electrode of the transistor may be the source of the transistor, while the second electrode of the transistor may be the drain of the transistor.

Figure 1:
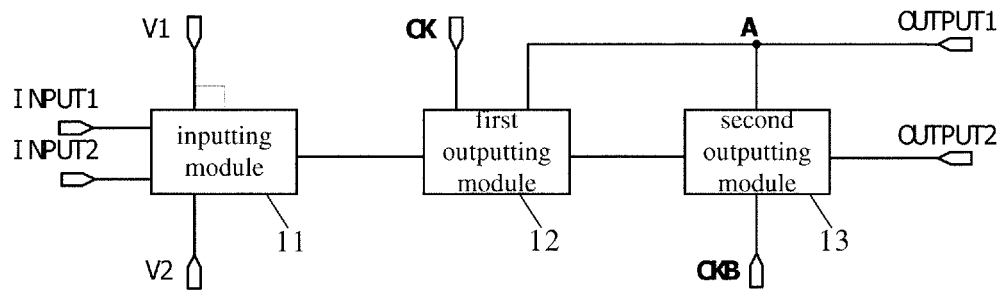
FIG. 1 is a schematic diagram illustrating a structure of a shift register unit according to embodiments of the present disclosure.

As illustrated in FIG. 1, a shift register unit according to the embodiments of the present disclosure comprises: an inputting module 11, a first outputting module 12 and a second outputting module 13.

The inputting module 11 is connected with a first signal input terminal INPUT1, a second signal input terminal INPUT2, a first voltage terminal V1, a second voltage terminal V2 and the first outputting module 12, and is configured to control a scan direction of the shift register unit according to a signal inputted from the first signal input terminal INPUT1, a signal inputted from the second signal input terminal INPUT2, a voltage inputted from the first voltage terminal V1 and a voltage inputted from the second voltage terminal V2.

The first outputting module 12 is connected with a first clock signal terminal CK, a first node A and a first signal output terminal OUTPUT1, and is configured to control a potential of a signal outputted from the first signal output terminal OUTPUT1 according to a signal inputted from the inputting module 11 and a first clock signal inputted from the first clock signal terminal CK, the first node A is a connection node of the first outputting module 12 and a second outputting module 13.

The second outputting module 13 is connected with the first node A, a second clock signal terminal CKB and a second signal output terminal OUTPUT2, and is configured to control a potential of a signal outputted from the second signal output terminal OUTPUT2 according to a signal at the first node A and a second clock signal inputted from the second clock signal terminal CKB.

In the shift register unit according to the embodiments of the present disclosure, the number of functional modules in the shift register unit can be reduced effectively, the structure of the shift register unit can be simplified, so that the number of use of the transistors can be further reduced and therefore a thin frame design for the display apparatus is realized while the circuit is ensured to operate stably.

Figure 2:
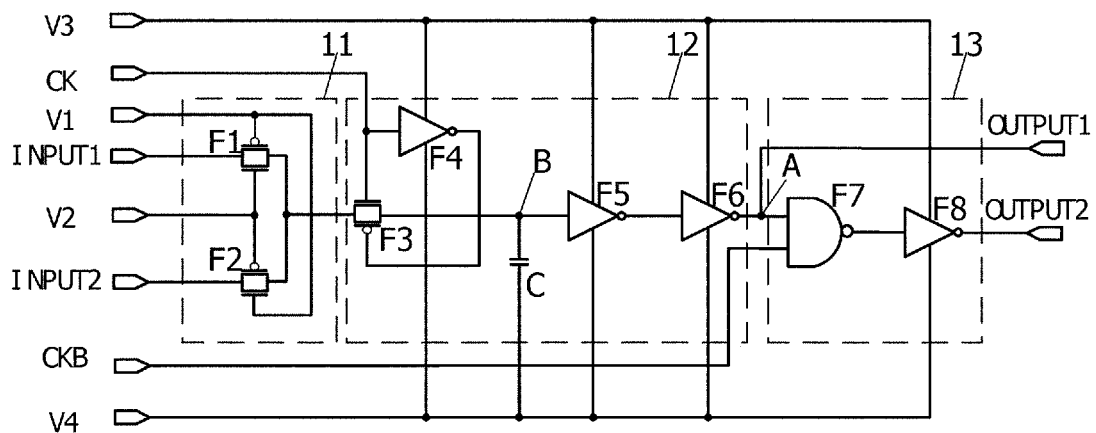
FIG. 2 is a schematic diagram illustrating a structure of another shift register unit according to the embodiments of the present disclosure.

As an example, as illustrated in FIG. 2, in the shift register unit according to the embodiments of the present disclosure, the inputting module 11 may comprises:

a first transfer gate F1, which is connected with the first signal input terminal INPUT1, the first voltage terminal V1 and the second voltage terminal V2, respectively, an output terminal of the first transfer gate F1 is connected with the first outputting module 12; and a second transfer gate F2, which is connected with the second signal input terminal INPUT2, the first voltage terminal V1 and the second voltage terminal V2, an output terminal of the second transfer gate F2 is connected with the first outputting module 12.

It should be noted that a plurality of transfer gate circuits may be included in the shift register unit according to the embodiments of the present disclosure, and the transfer gate circuits may function as analog switches for transferring an analog signal, and each transfer gate circuit may comprise a group of N-type transistors and P-type transistors disposed in parallel. Of course, the transfer gate circuit may further utilize other circuit structure or components having the switching function in the prior art, and the embodiments of the present disclosure are not limited thereto.

Figure 3:
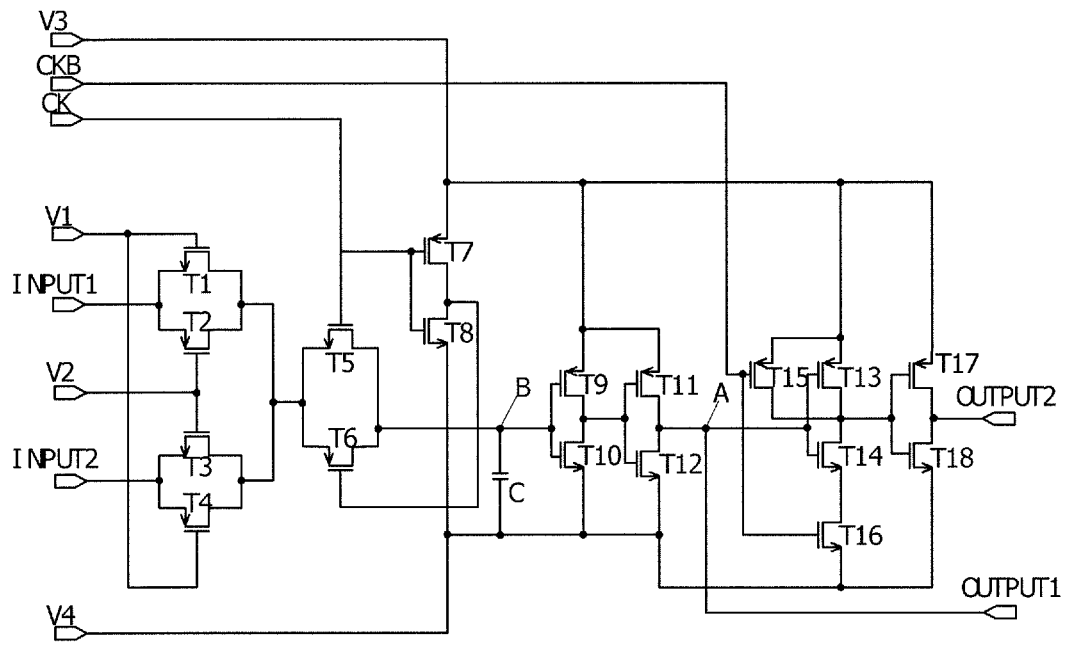
FIG. 3 is a schematic diagram illustrating a circuit connection structure of a shift register unit according to the embodiments of the present disclosure.

Specifically, as illustrated in the FIG. 3, the first transfer gate F1 can comprise:

a first transistor T1, a first electrode of the first transistor T1 is connected with the first signal input terminal INPUT1, a gate of the first transistor T1 is connected with the first voltage terminal V1, and a second electrode of the first transistor T1 is connected with the first outputting module 12; and a second transistor T2, a first electrode of the second transistor T2 is connected with the first signal input terminal INPUT1, a gate of the second transistor T2 is connected with the second voltage terminal V2, and a second electrode of the second transistor T2 is connected with the first outputting module 12.

The second transfer gate F2 can comprise:

a third transistor T3, a first electrode of the third transistor T3 is connected with the second signal input terminal INPUT2, a gate of the third transistor T3 is connected with the second voltage terminal V2, and a second electrode of the third transistor T3 is connected with the first outputting module 12; and a fourth transistor T4, a first electrode of the fourth transistor T4 is connected with the second signal input terminal INPUT2, a gate of the fourth transistor T4 is connected with the first voltage terminal V1, and a second electrode of the fourth transistor T4 is connected with the first outputting module 12.

With the inputting module 11 having such a structure, the inputting module 11 can realize a bi-direction scan of the gate driving circuit, when signals outputted from a previous stage and a next stage of shift register units are used as input signals of the first signal input terminal INPUT1 or the second signal input terminal INPUT2 of the current stage of shift register unit, respectively. Specifically, a signal N−1 OUT outputted from the first signal output terminal OUTPUT1 of the previous stage of shift register unit can be inputted to the first signal input terminal INPUT1 of the current stage of shift register unit, and a signal N+1 OUT outputted from the first signal output terminal OUTPUT1 of the next stage of shift register unit can be inputted to the second signal input terminal INPUT2 of the current stage of shift register unit.

In the shift register unit illustrated in FIG. 3, the first transistor T1 and the third transistor T3 are the N-type transistors, while the second transistor T2 and the fourth transistor T4 are the P-type transistors. For the inputting module 11 having such a structure, when a high level VDD is inputted from the first voltage terminal V1 and a low level VSS is inputted from the second voltage terminal V2, a high level outputted from the previous stage of shift register unit can pre-charge the first outputting module 12 through the inputting module 11, and the first outputting module 12 can be reset by a high level outputted from the next stage of shift register unit through the inputting module 11 so as to realize scanning and driving in a direction from up to down in the gate driving circuit.

When the low level VSS is inputted from the first voltage terminal V1 and the high level VDD is inputted from the second voltage terminal V2, the first outputting module 12 can be pre-charged by the high level outputted from the next stage of shift register unit through the inputting module 11, and the first outputting module 12 can be reset by the high level outputted from the previous stage of shift register unit through the inputting module 11, so as to realize scanning and driving in a direction from down to up in the gate driving circuit.

Alternatively, the signal N+1 OUT outputted from the first signal output terminal OUTPUT1 of the next stage of shift register unit can also be inputted to the first signal input terminal INPUT1 of the current stage of shift register unit, while the signal N−1 OUT outputted from the first signal output terminal OUTPUT1 of the previous stage of shift register unit can also be inputted to the second signal input terminal INPUT2 of the current stage of shift register unit. By utilizing a first voltage terminal V1 and a second voltage terminal V2 which are converse to the case described above, the bi-direction scan of the gate driving circuit can also be realized.

It should be noted that above descriptions are only illustrative explanations for the inputting module 11 to perform the bi-direction scan. It should be understood that the bi-direction scan of the gate driving circuit can also be realized by changing the high-low levels of the voltages inputted from the first voltage terminal V1 and the second voltage terminal V2, when the first transistor T1 and the third transistor T3 are the P-type transistors and the second transistor T2 and the fourth transistor T4 are the N-type transistors.

As an example, as illustrated in FIG. 2, in the shift register unit according to the embodiments of the present disclosure, the first outputting module 12 can comprise:

a third transfer gate F3, which is connected with the inputting module 11 and the first clock signal terminal CK, respectively, an output terminal of the third transfer gate F3 being connected with a second node B which is a node of the output terminal of the third transfer gate F3 and the first node A, it should be noted that the second node B and the first node A can be a same node in the present embodiment;

a capacitor C, one terminal of the capacitor C is connected with the second node B, and the other terminal of the capacitor C is connected with a fourth voltage terminal V4; and a first inverter F4, which is connected respectively with the first clock signal terminal CK, the third voltage terminal V3 and the fourth voltage terminal V4, and an output terminal of the first inverter F4 being connected with a control terminal of the third transfer gate F3.

It should be noted that a plurality of inverter circuits can be included in the shift register unit according to the embodiments of the present disclosure. The inverter circuit can perform an inverting process of 180° on the phase of the input signals, and each inverter circuit can comprise a pair of N-type transistor and P-type transistor disposed in series. Of course, the inverter circuit can further utilize other circuit structure or components having the inverting function in the prior art, and the embodiments of the present disclosure are not limited thereto.

The third voltage terminal V3 can be the high level VDD, and the fourth voltage terminal V4 can be a grounded terminal and the low level VSS. With such a circuit structure, the first outputting module 12 can control the potential of the signal outputted from the first signal output terminal OUTPUT1 according to a change in the potential of the signal inputted from the inputting module 11. The signal outputted from the first signal output terminal OUTPUT1 can be inputted to the signal input terminal of the previous or next stage of shift register unit, as a start signal or a reset signal to realize the bi-direction scan of the gate driving circuit.

In an actual application process, the first node A and the second node B can be different nodes, and the second node B can be connected to the first signal output terminal OUTPUT1 because a potential at the second node B satisfies the timing of the signal outputted from the first signal output terminal OUTPUT1. However, such manner is disadvantageous in that the driving ability at the second node B is comparatively low, so it is difficult to drive a large scale circuit and in turn the product quality of the display device is affected.

In order to improve the driving ability of the signal outputted from the first signal output terminal OUTPUT1, as illustrated in FIG. 2, the first outputting module 12 can further comprise:

at least one pair of inverters connected in series, which are disposed between the first node A and the second node B.

Herein, the first signal output terminal OUTPUT1 is connected with the first node A. Because the inverter has an effect for improving the driving ability, the driving ability of the signal outputted from the first signal output terminal OUTPUT1 can be improved effectively with the structure comprising the pairs of the inverters connected in series, without changing the phase of the outputted signal. For example, in the shift register unit illustrated in FIG. 2, there is a pair of inverters connected in series between the first node A and the second node B, that is, a second inverter F5 and a third inverter F6.

Specifically, as illustrated in FIG. 3, the third transfer gate F3 can comprise:

a fifth transistor T5, a first electrode of the fifth transistor T5 is connected with the inputting module 11, a gate of the fifth transistor T5 is connected with the first clock signal terminal CK, and a second electrode of the fifth transistor T5 is connected with the second node B; and a sixth transistor T6, a first electrode of the sixth transistor T6 is connected with the inputting module 11, and a second electrode of the sixth transistor T6 is connected with the second node B.

The first inverter F4 can comprise:

a seventh transistor T7, a first electrode of the seventh transistor T7 is connected with the third voltage terminal V3, a gate of the seventh transistor T7 is connected with the first clock signal terminal CK, and a second electrode of the seventh transistor T7 is connected with a gate of the sixth transistor T6; and an eighth transistor T8, a first electrode of the eighth transistor T8 is connected with the fourth voltage terminal V4, a gate of the eighth transistor T8 is connected with the first clock signal terminal CK, and a second electrode of the eighth transistor T8 is connected with the gate of the sixth transistor T6.

The second inverter F5 and the third inverter F6 connected in series are disposed between the first node A and the second node B, and the second inverter F5 comprises:

a ninth transistor T9, a first electrode of the ninth transistor T9 is connected with the third voltage terminal V3, a gate of the ninth transistor T9 is connected with the second node B, and a second electrode of the ninth transistor T9 is connected with the third inverter F6; and a tenth transistor T10, a first electrode of the tenth transistor T10 is connected with the fourth voltage terminal V4, a gate of the tenth transistor T10 is connected with the second node B, and a second electrode of the tenth transistor T10 is connected with the third inverter F6.

The third inverter F6 comprises:

an eleventh transistor T11, a first electrode of the eleventh transistor T11 is connected with the third voltage terminal V3, a gate of the eleventh transistor T11 is connected with the second inverter F5, and a second electrode of the eleventh transistor T11 is connected with the first node A; and a twelfth transistor T12, a first electrode of the twelfth transistor T12 is connected with the fourth voltage terminal V4, a gate of the twelfth transistor T12 is connected with the second inverter F5, and a second electrode of the twelfth transistor T12 is connected with the first node A.

Specifically, both of the second electrode of the ninth transistor T9 and the second electrode of the tenth transistor T10 are connected with the gate of the eleventh transistor T11 and the gate of the twelfth transistor T12, respectively, to realize the connection of the output terminal of the second inverter F5 with the input terminal of the third inverter F6.

Of course, more pairs of the inverters can be connected in series between the first node A and the second node B depending on requirements in actual designs, and will not be exemplified one by one herein. The first outputting module 12 having such structure can control the potential of the signal outputted from the first signal output terminal OUTPUT1 according to the signal inputted from the inputting module 11 and the clock signal inputted from the first clock signal terminal CK.

It should be noted that, the shift register unit illustrated in FIG. 3 is described by taking the transistors T5, T8, T10, T12 being the N-type transistors and the transistors T6, T7, T9, T11 being the P-type transistors as an example. It should be understood that the same functions as the above embodiments can be achieved by changing the third voltage terminal V3, the fourth voltage terminal V4 and the first clock signal terminal CK correspondingly, when the types of the above transistors are changed.

Additionally, as illustrated in FIG. 2, in the shift register unit according to the embodiments of the present disclosure, the second outputting module 13 can comprise:

an NAND gate F7, which is connected with the first node A, the third voltage terminal V3, the fourth voltage terminal V4 and the second clock signal terminal CKB, respectively, and an output terminal of the NAND gate F7 is connected with a fourth inverter F8.

The fourth inverter F8 is connected with the NAND gate F7, the third voltage terminal V3 and the fourth voltage terminal V4, respectively, and an output terminal of the fourth inverter F8 is connected with the second signal output terminal OUTPUT2.

It should be noted that, in the shift register unit according to the embodiments of the present disclosure, an NAND gate circuit can be composed of a group of AND gate circuits and a group of NOR gate circuits, and both of the AND gate circuit and the NOR gate circuit can comprise a pair of a N-type transistor and a P-type transistor disposed in series. Of course, the NAND gate circuit can further utilize other circuit structure or components having the NAND function in the prior art, and the embodiments of the present disclosure are not limited thereto.

Specifically, as illustrated in FIG. 3, the NAND gate F7 can comprise:

a thirteenth transistor T13, a first electrode of the thirteenth transistor T13 is connected with the third voltage terminal V3, a gate of the thirteenth transistor T13 is connected with the first node A, and a second electrode of the thirteenth transistor T13 is connected with the fourth inverter F8;

a fourteenth transistor T14, a gate of the fourteenth transistor T14 is connected with the first node A, and a second electrode of the fourteenth transistor T14 is connected with the fourth inverter F8;

a fifteenth transistor T15, a first electrode of the fifteenth transistor T15 is connected with the third voltage terminal V3, a gate of the fifteenth transistor T15 is connected with the second clock signal terminal CKB, and a second electrode of the fifteenth transistor T15 is connected with the fourth inverter F8; and a sixteenth transistor T16, a first electrode of the sixteenth transistor T16 is connected with the fourth voltage terminal V4, a gate of the sixteenth transistor T16 is connected with the second clock signal terminal CKB, and a second electrode of the sixteenth transistor T16 is connected with the first electrode of the fourteenth transistor T14.

The fourth inverter F8 can comprise:

a seventeenth transistor T17, a first electrode of the seventeenth transistor T17 is connected with the third voltage terminal V3, a gate of the seventeenth transistor T17 is connected with the NAND gate F7, and a second electrode of the seventeenth transistor T17 is connected with the second signal output terminal OUTPUT2; and an eighteenth transistor T18, a first electrode of the eighteenth transistor T18 is connected with the fourth voltage terminal V4, a gate of the eighteenth transistor T18 is connected with the NAND gate F7, and a second electrode of the eighteenth transistor T18 is connected with the second signal output terminal OUTPUT2.

Specifically, the second electrode of the thirteenth transistor T13, the second electrode of the fourteenth transistor T14 and the second electrode of the fifteenth transistor T15 are all connected with the gate of the seventeenth transistor T17 and the gate of the eighteenth transistor T18, respectively, so that it is realized that the output terminal of the NAND gate F7 is connected to the input terminal of the fourth inverter F8.

It should be noted that, the shift register unit illustrated in FIG. 3 is described by taking the transistors T14, T16, T18 being the N-type transistors and the transistors T13, T15, T17 being the P-type transistors as an example. It should be understood that the same function as the above embodiments can be achieved by changing the third voltage terminal V3, the fourth voltage terminal V4 and the second clock signal terminal CKB correspondingly, when the types of the above transistors are changed.

In the shift register unit illustrated in FIG. 3, there comprise 9 N-type transistors, 9 P-type transistors and one capacitor respectively. Compared with the prior art, with such design for the circuit structure, the number of functional modules in the shift register unit is reduced effectively, the structure of the shift register unit is simplified, and the number of use of the transistors is further reduced, so that difficulties in the circuit design and manufacture are decreased remarkably, and sizes for the circuit area and wiring space are controlled effectively, and therefore a thin frame design for the display apparatus is realized while the circuit is ensured to operate stably.

Figure 4:
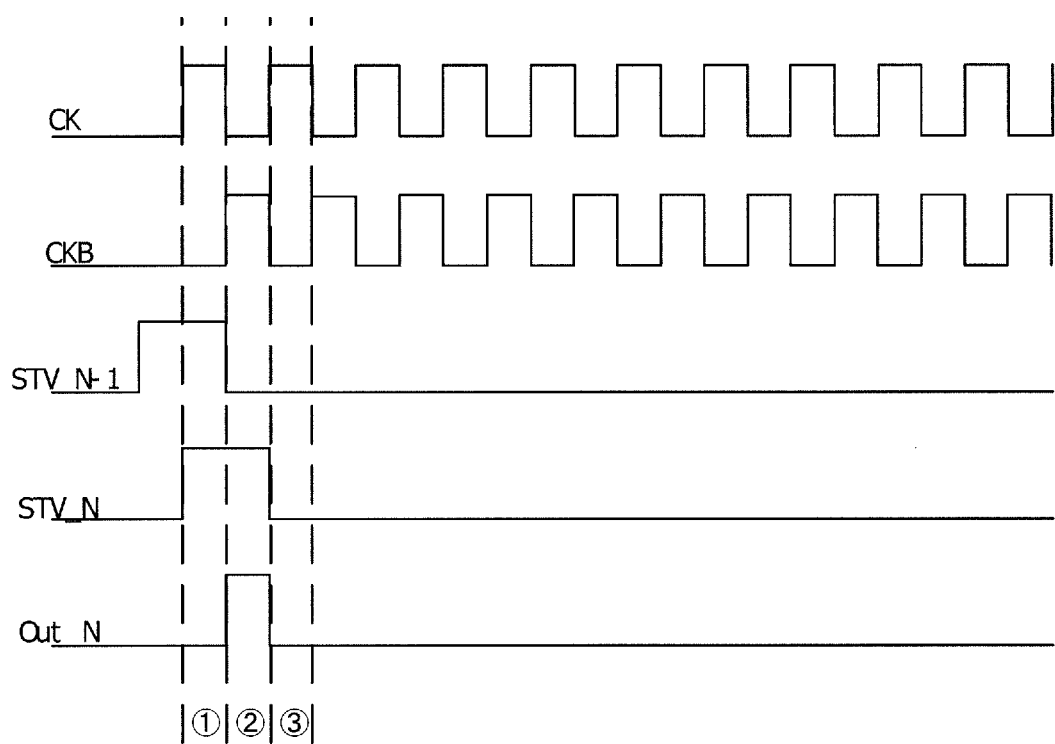
FIG. 4 is a waveform diagram illustrating signal timings when the shift register unit operates according to the embodiments of the present disclosure.

The shift register unit adopting such a structure can realize the bi-direction scan of the gate driving circuit by changing the high-low level of the control signals. Specifically, a driving method of the shift register unit, illustrated in FIG. 3, according to the embodiments of the present disclosure and its operation states will be described in details below in connection with a signal timing state diagram shown in FIG. 4.

Stage ①: the first signal input terminal INPUT1 of the current stage of shift register unit is connected with the first signal output terminal of the previous stage of shift register unit and receives a signal STV_N−1 from the previous stage of shift register unit; the second signal input terminal INPUT2 of the current stage of shift register unit is connected with the first signal output terminal of the next stage of shift register unit and receives a signal STV_N+1 from the next stage of shift register unit. In this stage, the signal STV_N−1 is at the high level, and the transfer gate F3 is turned on when the first clock signal inputted from the first clock signal terminal CK is at the high level, the signal STV_N−1 charges the capacitor C through the transfer gate F3, so that the capacitor C is at a high potential and outputs a signal STV_N with the high level to the first signal output terminal OUTPUT1 of the current stage of shift register unit by means of amplifying functions of the two stages of inverters F5 and F6.

Stage ②: in this stage, the transfer gate F3 is turned off when the first clock signal inputted from the first clock signal terminal CK is at the low level and the second clock signal inputted from the second clock signal terminal CKB is at the high level so that the voltage across the capacitor C cannot be discharged, which renders the voltage is held at the high potential and the signal STV_N goes on to be held at the high potential; further, also because the second clock signal inputted from the second clock signal terminal CKB is at the high level, the NAND gate F7 outputs a signal Out_N with the high level to the second signal output terminal OUTPUT2 of the current stage of shift register unit through the inverter F8.

Stage ③: in this stage, the first clock signal inputted from the clock signal terminal CK is at the high level, the second clock signal inputted from the second clock signal terminal CKB is at the low level, the signal STV_N−1 is at the low level and the transfer gate F3 is turned on, the capacitor C is discharged by the signal STV_N−1 through the transfer gate F3, so that the capacitor C is at the low level, and outputs the signal STV_N with the low level to the first signal output terminal OUTPUT1 of the current stage of shift register unit by means of the amplifying functions of the two inverters F5 and F6 while outputting the signal Out_N with the low level to the second signal output terminal OUTPUT2 of the current stage of shift register unit through subsequent inverters and NAND gates.

As such, a shift from the Out_N−1 to the Out_N at the current stage and then to the Out_N_1 is realized, that is to say, a gate line driving and scanning output from up to down is realized. It should be noted that, in the embodiments of the present disclosure, the manners of pre-charging and resetting can be converted by changing the high-low potentials of the signals STV_N−1, STV_N+1, VDD and VSS, so that the bi-direction scan of the gate driving circuit from up to down or from down to up is realized respectively.

With the shift register unit according to the embodiments of the present disclosure, the number of function modules in the shift register unit can be reduced effectively, the structure of the shift register unit can be simplified, so that the number of use of the transistors can be further reduced and therefore a thin frame design for the display apparatus is realized while the circuit is ensured to operate stably.

Figure 5:
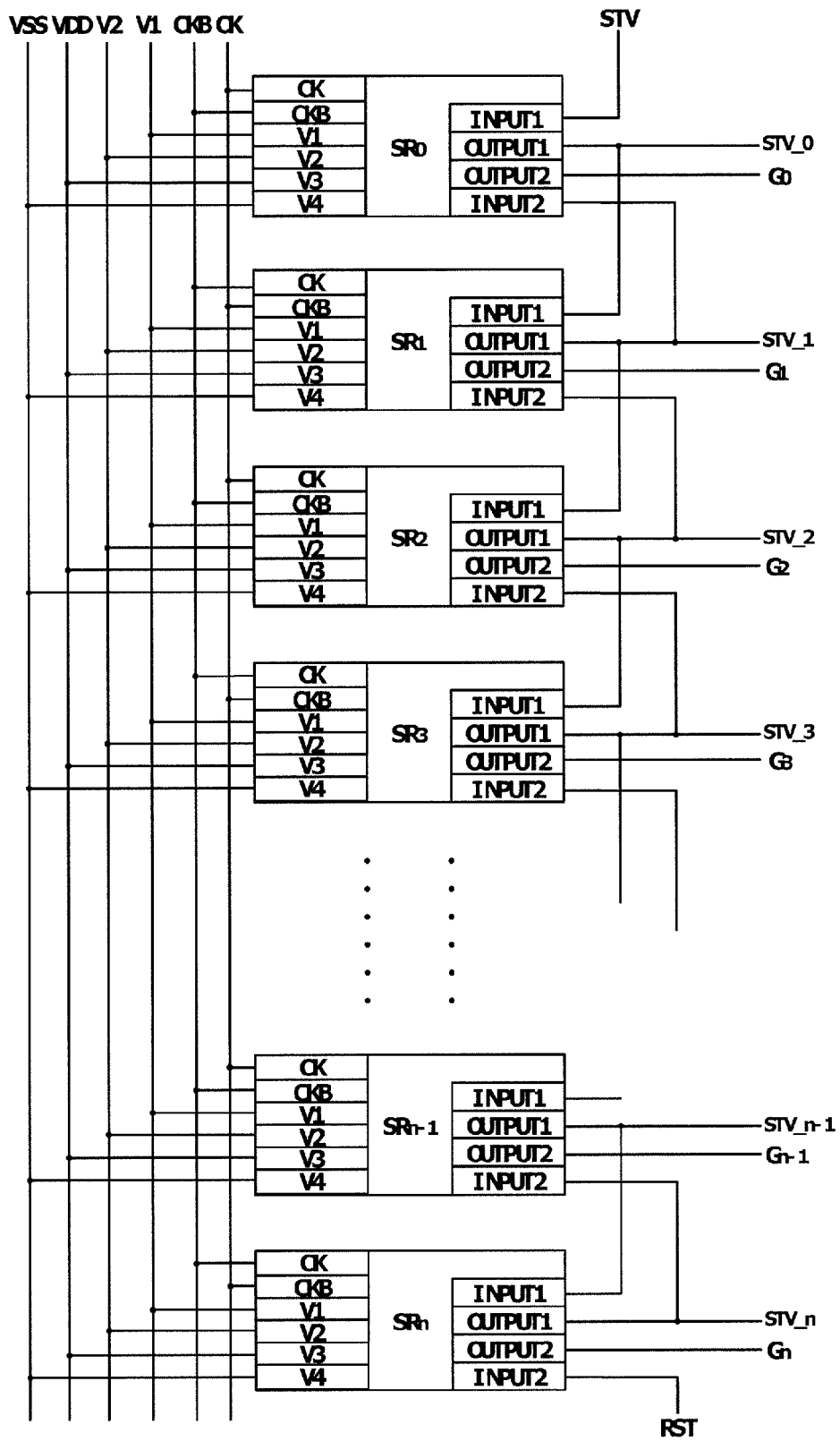
FIG. 5 is a schematic diagram illustrating a structure of a gate driving circuit according to the embodiments of the present disclosure.

As illustrated in FIG. 5, a gate driving circuit according to the embodiments of the present disclosure comprises a plurality of stages of above shift register units. Herein, the second signal output terminal OUTPUT2 of each stage of shift register unit SR outputs a line scan signal G for the current stage.

Except for the first stage of shift register unit SR0, the first signal output terminal OUTPUT1 of each of the remaining shift register units is connected with a second signal input terminal INPUT2 of the previous stage of shift register unit adjacent thereto; and except for the last stage of shift register unit SRn, the first signal output terminal OUTPUT1 of each of the remaining shift register units is connected with a first signal input terminal INPUT1 of a next stage of shift register unit adjacent thereto.

In the embodiments of the present disclosure, a frame start signal STV can be inputted to the first signal input terminal INPUT1 of the first stage of shift register unit SR0; and a reset signal RST can be inputted to the second signal input terminal INPUT2 of the last stage of shift register unit SRn. Herein, a same data line can be used to provide the frame start signal STV and the reset signal RST to the first stage of shift register unit SR0 and the last stage of shift register unit SRn, respectively.

The gate driving circuit according to the embodiments of the present disclosure comprises a plurality of shift register units, the number of functional modules in the shift register unit can be reduced effectively, the structure of the shift register unit can be simplified, so that the number of use of the transistors can be further reduced and therefore a thin frame design for the display apparatus is realized while the circuit is ensured to operate stably.

When signals outputted from a previous stage and a next stage of shift register units are used respectively as input signals of the first signal input terminal INPUT1 or the second signal input terminal INPUT2, the inputting module 11 can realize a bi-direction scan of the gate driving circuit. Specifically, a signal N−1 OUT outputted from the first signal output terminal OUTPUT1 of the previous stage of shift register unit can be inputted to the first signal input terminal INPUT1 of the current stage of shift register unit, and a signal N+1 OUT outputted from the first signal output terminal OUTPUT1 of the next stage of shift register unit can be inputted to the second signal input terminal INPUT2 of the current stage of shift register unit.

In the shift register unit illustrated in FIG. 3, the first transistor T1 and the third transistor T3 are the N-type transistors, while the second transistor T2 and the fourth transistor T4 are the P-type transistors. For the inputting module 11 having such a structure, when a high level VDD is inputted from the first voltage terminal V1 and a low level VSS is inputted from the second voltage terminal V2, a high level outputted from the previous stage of shift register unit can pre-charge the first outputting module 12 through the inputting module 11, and a high level outputted from the next stage of shift register unit can reset the first outputting module 12 through the inputting module 11, so that the gate driving circuit is realized to scan and drive in a direction from up to down.

Further, when the first voltage terminal V1 inputs the low level VSS and the second voltage terminal V2 inputs the high level VDD, the high level outputted from the next stage of shift register unit can pre-charge the first outputting module 12 through the inputting module 11, and the high level outputted from the previous stage of shift register unit can reset the first outputting module 12 through the inputting module 11, so that the gate driving circuit is realized to scan and drive in a direction from down to up.

Alternatively, the signal N+1 OUT outputted from the first signal output terminal OUTPUT1 of the next stage of shift register unit can also be inputted to the first signal input terminal INPUT1 of the current stage of shift register unit, while the signal N−1 OUT outputted from the first signal output terminal OUTPUT1 of the previous stage of shift register unit can also be inputted to the second signal input terminal INPUT2 of the current stage of shift register unit. By utilizing a first voltage terminal V1 and a second voltage terminal V2 which are converse to the case described above, the bi-direction scan of the gate driving circuit can also be realized.

It should be noted that above descriptions are only illustrative explanations for the inputting module 11 to perform the bi-direction scan. It should be understood that the bi-direction scan of the gate driving circuit can also be realized by changing the high-low levels of the voltages inputted from the first voltage terminal V1 and the second voltage terminal V2, when the first transistor T1 and the third transistor T3 are the P-type transistors and the second transistor T2 and the fourth transistor T4 are the N-type transistors.

There further provide in the embodiments of the present disclosure a display apparatus comprising the gate driving circuit described above.

The structure of the gate driving circuit has been described in the previous embodiments in details, and will not be described again herein.

The display apparatus according to the embodiments of the present disclosure comprises the gate driving circuit including the plurality of the shift register units, the number of function modules in the shift register unit can be reduced effectively, the structure of the shift register unit can be simplified, so that the number of use of the transistors can be further reduced and therefore a thin frame design for the display apparatus is realized while the circuit is ensured to operate stably.

The above descriptions only illustrate the specific embodiments of the present invention, and the protection scope of the present invention is not limited to this. Given the teaching as disclosed herein, variations or substitutions, which can easily occur to any skilled pertaining to the art, should be covered by the protection scope of the present invention. Thus, the protection scope of the present invention is defined by the claims.

What is claimed is:

1. A shift register unit comprising:
an inputting module connected with a first signal input terminal, a second signal input terminal, a first voltage terminal, a second voltage terminal and a first outputting module, and configured to control a scan direction of the shift register unit according to a signal inputted from the first signal input terminal, a signal inputted from the second signal input terminal, a voltage inputted from the first voltage terminal and a voltage inputted from the second voltage terminal;
the first outputting module connected with a first clock signal terminal, a first node and a first signal output terminal, and configured to control a potential of a signal outputted from the first signal output terminal according to a signal outputted from the inputting module and a first clock signal inputted from the first clock signal terminal, the first node being a connection node of the first outputting module and a second outputting module; and
the second outputting module connected with the first node, a second clock signal terminal and a second signal output terminal, and configured to control a potential of a signal outputted from the second signal output terminal according to a signal at the first node and a second clock signal inputted from the second clock signal terminal.

2. The shift register unit of claim 1, wherein the inputting module comprises:
a first transfer gate connected with the first signal input terminal, the first voltage terminal and the second voltage terminal, respectively, and having an output terminal connected with the first outputting module; and
a second transfer gate connected with the second signal input terminal, the first voltage terminal and the second voltage terminal, and having an output terminal connected with the first outputting module.

3. The shift register unit of claim 2, wherein the first transfer gate comprises:
a first transistor whose first electrode is connected with the first signal input terminal, gate is connected with the first voltage terminal, and second electrode is connected with the first outputting module; and
a second transistor whose first electrode is connected with the first signal input terminal, gate is connected with the second voltage terminal, and second electrode is connected with the first outputting module,
the second transfer gate comprises:
a third transistor whose first electrode is connected with the second signal input terminal, gate is connected with the second voltage terminal, and second electrode is connected with the first outputting module; and
a fourth transistor whose first electrode is connected with the second signal input terminal, gate is connected with the first voltage terminal, and second electrode is connected with the first outputting module.

4. The shift register unit of claim 1, wherein the first outputting module comprises:
a third transfer gate connected with the inputting module and the first clock signal terminal, respectively, and having an output terminal connected with a second node which is a node of the output terminal of the third transfer gate and the first node;
a capacitor whose one terminal is connected with the second node, and other terminal is connected with a fourth voltage terminal; and
a first inverter connected with the first clock signal terminal, the third voltage terminal and the fourth voltage terminal respectively, and having an output terminal connected with a control terminal of the third transfer gate.

5. The shift register unit of claim 4, wherein the first outputting module further comprises:
at least one pair of inverters connected in series, which are disposed between the first node and the second node.

6. The shift register unit of claim 5, wherein the third transfer gate comprises:
a fifth transistor whose first electrode is connected with the inputting module, gate is connected with the first clock signal terminal, and second electrode is connected with the second node; and
a sixth transistor whose first electrode is connected with the inputting module, and second electrode is connected with the second node,
the first inverter comprises:
a seventh transistor whose first electrode is connected with the third voltage terminal, gate is connected with the first clock signal terminal, and second electrode is connected with a gate of the sixth transistor; and
an eighth transistor whose first electrode is connected with the fourth voltage terminal, gate is connected with the first clock signal terminal, and second electrode is connected with the gate of the sixth transfer gate,
the second inverter and the third inverter connected in series are disposed between the first node and the second node, and the second inverter comprises:

a ninth transistor whose first electrode is connected with the third voltage terminal, gate is connected with the second node, and second electrode is connected with the third inverter; and a tenth transistor whose first electrode is connected with the fourth voltage terminal, gate is connected with the second node, and second electrode is connected with the third inverter, the third inverter comprises:

an eleventh transistor whose first electrode is connected with the third voltage terminal, gate is connected with the second inverter, and second electrode is connected with the first node; and a twelfth transistor whose first electrode is connected with the fourth voltage terminal, gate is connected with the second inverter, and second electrode is connected with the first node.

7. The shift register unit of claim 1, wherein the second outputting module comprises:

an NAND gate connected with the first node, the third voltage terminal, the fourth voltage terminal and the second clock signal terminal, respectively, and having an output terminal connected with a fourth inverter; and the fourth inverter connected with the NAND gate, the third voltage terminal and the fourth voltage terminal, respectively, and having an output terminal connected with the second signal output terminal.

8. The shift register unit of claim 7, wherein the NAND gate comprises:

a thirteenth transistor whose first electrode is connected with the third voltage terminal, gate is connected with the first node, and second electrode is connected with the fourth inverter;

a fourteenth transistor whose gate is connected with the first node, and second electrode is connected with the fourth inverter;

a fifteenth transistor whose first electrode is connected with the third voltage terminal, gate is connected with the second clock signal terminal, and second electrode is connected with the fourth inverter; and a sixteenth transistor whose first electrode is connected with the fourth voltage terminal, gate is connected with the second clock signal terminal, and second electrode is connected with the first electrode of the fourteenth transistor, the fourth inverter comprises:

a seventeenth transistor whose first electrode is connected with the third voltage terminal, gate is connected with the NAND gate, and second electrode is connected with the second signal output terminal; and an eighteenth transistor whose first electrode is connected with the fourth voltage terminal, gate is connected with the NAND gate, and second electrode is connected with the second signal output terminal.

9. A gate driving circuit comprising a plurality of stages of the shift register units of claim 1;

except for a first stage of shift register unit, a first signal output terminal of each remaining shift register unit is connected with a second signal input terminal of a previous stage of shift register unit adjacent thereto; and except for a last stage of shift register unit, the first signal output terminal of each remaining shift register unit is connected with a first signal input terminal of a next stage of shift register unit adjacent thereto.

10. The gate driving circuit of claim 9, wherein a frame start signal is inputted to the first signal input terminal of the first stage of shift register unit; and a reset signal is inputted to the second signal input terminal of the last stage of shift register unit.

11. A display apparatus comprising the gate driving circuit of claim 9.

12. The display apparatus of claim 11, wherein a frame start signal is inputted to the first signal input terminal of the first stage of shift register unit; and a reset signal is inputted to the second signal input terminal of the last stage of shift register unit.

13. The gate driving circuit of claim 9, wherein the inputting module comprises:

a first transfer gate connected with the first signal input terminal, the first voltage terminal and the second voltage terminal, respectively, and having an output terminal connected with the first outputting module; and a second transfer gate connected with the second signal input terminal, the first voltage terminal and the second voltage terminal, and having an output terminal connected with the first outputting module.

14. The gate driving circuit of claim 13, wherein the first transfer gate comprises:

a first transistor whose first electrode is connected with the first signal input terminal, gate is connected with the first voltage terminal, and second electrode is connected with the first outputting module; and a second transistor whose first electrode is connected with the first signal input terminal, gate is connected with the second voltage terminal, and second electrode is connected with the first outputting module, the second transfer gate comprises:

a third transistor whose first electrode is connected with the second signal input terminal, gate is connected with the second voltage terminal, and second electrode is connected with the first outputting module; and a fourth transistor whose first electrode is connected with the second signal input terminal, gate is connected with the first voltage terminal, and second electrode is connected with the first outputting module.

15. The gate driving circuit of claim 9, wherein the first outputting module comprises:

a third transfer gate connected with the inputting module and the first clock signal terminal, respectively, and having an output terminal connected with a second node which is a node of the output terminal of the third transfer gate and the first node;

a capacitor whose one terminal is connected with the second node, and other terminal is connected with a fourth voltage terminal; and a first inverter connected with the first clock signal terminal, the third voltage terminal and the fourth voltage terminal respectively, and having an output terminal connected with a control terminal of the third transfer gate.

16. The gate driving circuit of claim 15, wherein the first outputting module further comprises:

at least one pair of inverters connected in series, which are disposed between the first node and the second node.

17. The gate driving circuit of claim 16, wherein the third transfer gate comprises:

a fifth transistor whose first electrode is connected with the inputting module, gate is connected with the first clock signal terminal, and second electrode is connected with the second node; and a sixth transistor whose first electrode is connected with the inputting module, and second electrode is connected with the second node, the first inverter comprises:
a seventh transistor whose first electrode is connected with the third voltage terminal, gate is connected with the first clock signal terminal, and second electrode is connected with a gate of the sixth transistor; and
an eighth transistor whose first electrode is connected with the fourth voltage terminal, gate is connected with the first clock signal terminal, and second electrode is connected with the gate of the sixth transfer gate,
the second inverter and the third inverter connected in series are disposed between the first node and the second node, and the second inverter comprises:
a ninth transistor whose first electrode is connected with the third voltage terminal, gate is connected with the second node, and second electrode is connected with the third inverter; and
a tenth transistor whose first electrode is connected with the fourth voltage terminal, gate is connected with the second node, and second electrode is connected with the third inverter,
the third inverter comprises:
an eleventh transistor whose first electrode is connected with the third voltage terminal, gate is connected with the second inverter, and second electrode is connected with the first node; and
a twelfth transistor whose first electrode is connected with the fourth voltage terminal, gate is connected with the second inverter, and second electrode is connected with the first node.

18. The gate driving circuit of claim 9, wherein the second outputting module comprises:
an NAND gate connected with the first node, the third voltage terminal, the fourth voltage terminal and the second clock signal terminal, respectively, and having an output terminal connected with a fourth inverter; and
the fourth inverter connected with the NAND gate, the third voltage terminal and the fourth voltage terminal, respectively, and having an output terminal connected with the second signal output terminal.

19. The gate driving circuit of claim 18, wherein the NAND gate comprises:
a thirteenth transistor whose first electrode is connected with the third voltage terminal, gate is connected with the first node, and second electrode is connected with the fourth inverter;
a fourteenth transistor whose gate is connected with the first node, and second electrode is connected with the fourth inverter;
a fifteenth transistor whose first electrode is connected with the third voltage terminal, gate is connected with the second clock signal terminal, and second electrode is connected with the fourth inverter; and
a sixteenth transistor whose first electrode is connected with the fourth voltage terminal, gate is connected with the second clock signal terminal, and second electrode is connected with the first electrode of the fourteenth transistor,
the fourth inverter comprises:
a seventeenth transistor whose first electrode is connected with the third voltage terminal, gate is connected with the NAND gate, and second electrode is connected with the second signal output terminal; and
an eighteenth transistor whose first electrode is connected with the fourth voltage terminal, gate is connected with the NAND gate, and second electrode is connected with the second signal output terminal.

* * * * *